(12) United States Patent
Sun et al.

(10) Patent No.: US 9,356,316 B2
(45) Date of Patent: May 31, 2016

(54) PINHOLE-FREE SOLID STATE ELECTROLYTES WITH HIGH IONIC CONDUCTIVITY

(71) Applicant: APPLIED MATERIALS, INC., Santa Clara, CA (US)

(72) Inventors: Lizhong Sun, San Jose, CA (US); Chong Jiang, Cupertino, CA (US); Byung-Sung Leo Kwak, Portland, OR (US)

(73) Assignee: Applied Materials, Inc., Santa Clara, CA (US)

(*) Notice: Subject to any disclaimer, the term of this patent is extended or adjusted under 35 U.S.C. 154(b) by 102 days.

(21) Appl. No.: 13/865,447

(22) Filed: Apr. 18, 2013

(65) Prior Publication Data
US 2013/0280581 A1 Oct. 24, 2013

Related U.S. Application Data

(60) Provisional application No. 61/635,215, filed on Apr. 18, 2012, provisional application No. 61/749,191, filed on Jan. 4, 2013.

(51) Int. Cl.
*H01M 10/0562* (2010.01)
*H01M 6/18* (2006.01)
(Continued)

(52) U.S. Cl.
CPC ......... *H01M 10/0562* (2013.01); *G02F 1/1508* (2013.01); *H01G 11/56* (2013.01);
(Continued)

(58) Field of Classification Search
CPC ... H01M 2/16; H01M 10/00; H01M 10/0561; H01M 10/0562
USPC .......... 429/304, 248, 251, 252, 302, 322; 427/126.1, 126.3
See application file for complete search history.

(56) References Cited

U.S. PATENT DOCUMENTS

| 4,824,546 A | 4/1989 | Ohmi |
| 5,116,482 A | 5/1992 | Setoyama et al. |

(Continued)

FOREIGN PATENT DOCUMENTS

| EP | 1667272 A1 | 6/2006 |
| JP | 02-036549 | 2/1990 |
| WO | WO 2011-066518 A1 | 6/2011 |

OTHER PUBLICATIONS

U.S. 5,718,739, 1/1993, Barnes et al. (withdrawn).
(Continued)

*Primary Examiner* — Patrick Ryan
*Assistant Examiner* — Julian Anthony
(74) *Attorney, Agent, or Firm* — Pillsbury Winthrop Shaw Pittman LLP (57) ABSTRACT

The present invention relates to vacuum-deposited solid state electrolyte layers with high ionic conductivity in electrochemical devices, and methods and tools for fabricating said electrolyte layers. An electrochemical device may comprise solid state electrolytes with incorporated thin layers and/or particles of transition metal oxides, silicon, silicon oxide, or other suitable materials that will induce an increase in ionic conductivity of the electrolyte stack (for example, materials with which lithium is able to intercalate), or mixtures thereof. An improvement in ionic conductivity of the solid state electrolyte is expected which is proportional to the number of incorporated layers or a function of the distribution uniformity and density of the particles within the electrolyte. Embodiments of the present invention are applicable to solid state electrolytes in a broad range of electrochemical devices including thin film batteries, electrochromic devices and ultracapacitors. The solid state electrolyte layers may be nominally pinhole-free.

25 Claims, 10 Drawing Sheets (51) Int. Cl.
*H01M 2/16* (2006.01)
*H01M 6/14* (2006.01)
*B05D 5/12* (2006.01)
*H01G 11/56* (2013.01)
*G02F 1/15* (2006.01)
*H01L 49/02* (2006.01)
*H01M 10/04* (2006.01)
*H01M 10/052* (2010.01)
*H01M 10/0585* (2010.01)

(52) U.S. Cl.
CPC .......... *H01L 28/40* (2013.01); *H01M 10/0436* (2013.01); *H01M 10/052* (2013.01); *H01M 10/0585* (2013.01); *H01M 2300/0068* (2013.01); *Y02E 60/13* (2013.01)

(56) References Cited

U.S. PATENT DOCUMENTS

| | | | |
|---|---|---|---|
| 5,995,271 | A | 11/1999 | Zieba et al. |
| 6,320,311 | B2 | 11/2001 | Nakaya et al. |
| 6,376,027 | B1 | 4/2002 | Lee et al. |
| 6,506,289 | B2 | 1/2003 | Demaray et al. |
| 6,818,356 | B1 | 11/2004 | Bates |
| 6,827,826 | B2 | 12/2004 | Demaray et al. |
| 6,863,399 | B1 | 3/2005 | Newsome |
| 7,247,221 | B2 | 7/2007 | Stowell, Jr. |
| 7,469,558 | B2 | 12/2008 | Demaray et al. |
| 7,476,602 | B2 | 1/2009 | Ajmera et al. |
| 2004/0018424 | A1 | 1/2004 | Zhang et al. |
| 2004/0106046 | A1 | 6/2004 | Inda |
| 2004/0258984 | A1 | 12/2004 | Ariel et al. |
| 2005/0095506 | A1* | 5/2005 | Klaassen ............ 429/322 |
| 2008/0032200 | A1 | 2/2008 | Bates |
| 2009/0148764 | A1 | 6/2009 | Kwak et al. |
| 2009/0162755 | A1 | 6/2009 | Neudecker |
| 2009/0288943 | A1 | 11/2009 | Kwak et al. |
| 2009/0317724 | A1* | 12/2009 | Kumar et al. ............ 429/320 |
| 2010/0233548 | A1 | 9/2010 | Pijnenburg et al. |
| 2010/0285237 | A1 | 11/2010 | Ditizio |
| 2010/0285372 | A1 | 11/2010 | Lee et al. |
| 2011/0168327 | A1 | 7/2011 | Oladeji |
| 2012/0318664 | A1 | 12/2012 | Jiang et al. |
| 2012/0321815 | A1 | 12/2012 | Song et al. |

OTHER PUBLICATIONS

International Search Report and Written Opinion Issued Jul. 29, 2013 for PCT/US2013/037184.

Nimisha, C.S., et al., "Sputter deposited LiPON thin films from powder target as electrolyte for thin film battery applications," vol. 519, Issue 10, Mar. 1, 2011, pp. 3401-3406.

Xu, F., et al., "Properties of lithisum phosphorous oxynitride (Lipon) for 3D solid-state lithium batteries," J. Mater. Res. vol. 25, No. 8, Aug. 2010, pp. 1507-1515.

Granqvist, C,-G., "Electrochromic Materials: Out of a Niche," Nature Materials, vol. 5, No. 2, Feb. 2006, pp. 89-90.

Hamon, Y. et al., "Influence of sputtering conditions on ionic conductivity of LiPON thin films," Solid State Ionics, vol. 177, Issues 3-4, Jan. 31, 2006, pp. 257.261.

Dudney, N. J., "Solid-State Thin-Film Rechargeable Batteries," Materials Science and Engineering B 116 (2005), pp. 245-249.

Werbaneth, P., et al., "The Reactive Ion Etching of Au on GaAs Substrates in a High Density Plasma Etch Reactor," The International Conference on Compound Semiconductor Manufacturing Technology, St. Louis, 1999, 4 pages. Available at: http://gaasmantech.comDigests/1999/PDF12.pdf, last viewed on Nov. 4, 2013.

Extended European Search Report for European Patent Application No. 13777518.6 issued Sep. 11, 2015.

* cited by examiner

FIG. 1

PRIOR ART

PINHOLE-FREE SOLID STATE ELECTROLYTES WITH HIGH IONIC CONDUCTIVITY

CROSS-REFERENCE TO RELATED APPLICATIONS

This application claims the benefit of U.S. Provisional Application No. 61/635,215 filed Apr. 18, 2012, and U.S. Provisional Application No. 61/749,191 filed Jan. 4, 2013, both incorporated herein by reference in their entirety.

FIELD OF THE INVENTION

Embodiments of the present invention relate generally to solid state electrolytes in electrochemical devices, including thin film batteries and electrochromic devices, and more particularly to high ionic conductivity solid state electrolytes and pinhole-free solid state electrolytes with high ionic conductivity.

BACKGROUND OF THE INVENTION

Solid state electrolytes have attracted interest for many years because of their wide applications in many types of solid state electrochemical devices. The solid state electrolyte, lithium phosphorous oxynitride (LiPON), in addition to having outstanding Li ion conductivity in solid state electrolytes, has excellent chemical and physical stability in general and, more importantly, at the interfaces with cathodes and anodes. However, due to poor ionic conductivities in LiPON, compared with liquid state electrolytes, the usages of solid state electrolytes are very much limited. There have been many attempts to improve ionic conductivity of solid state electrolytes by (1) optimizing deposition conditions and (2) changing the chemical composition of the solid. However, the improvements, so far, have yet to be significant—for example, the ionic conductivity for commonly used LiPON is still less than a few μS/cm.

In thin film batteries (TFBs) and electrochromic devices, a pinhole in the solid state electrolyte film can compromise the function of the device. For example, a pinhole in the solid state electrolyte film can reduce the breakdown voltage of the device, or worse still lead to a short between conducting layers and render the device useless.

Figure 1:
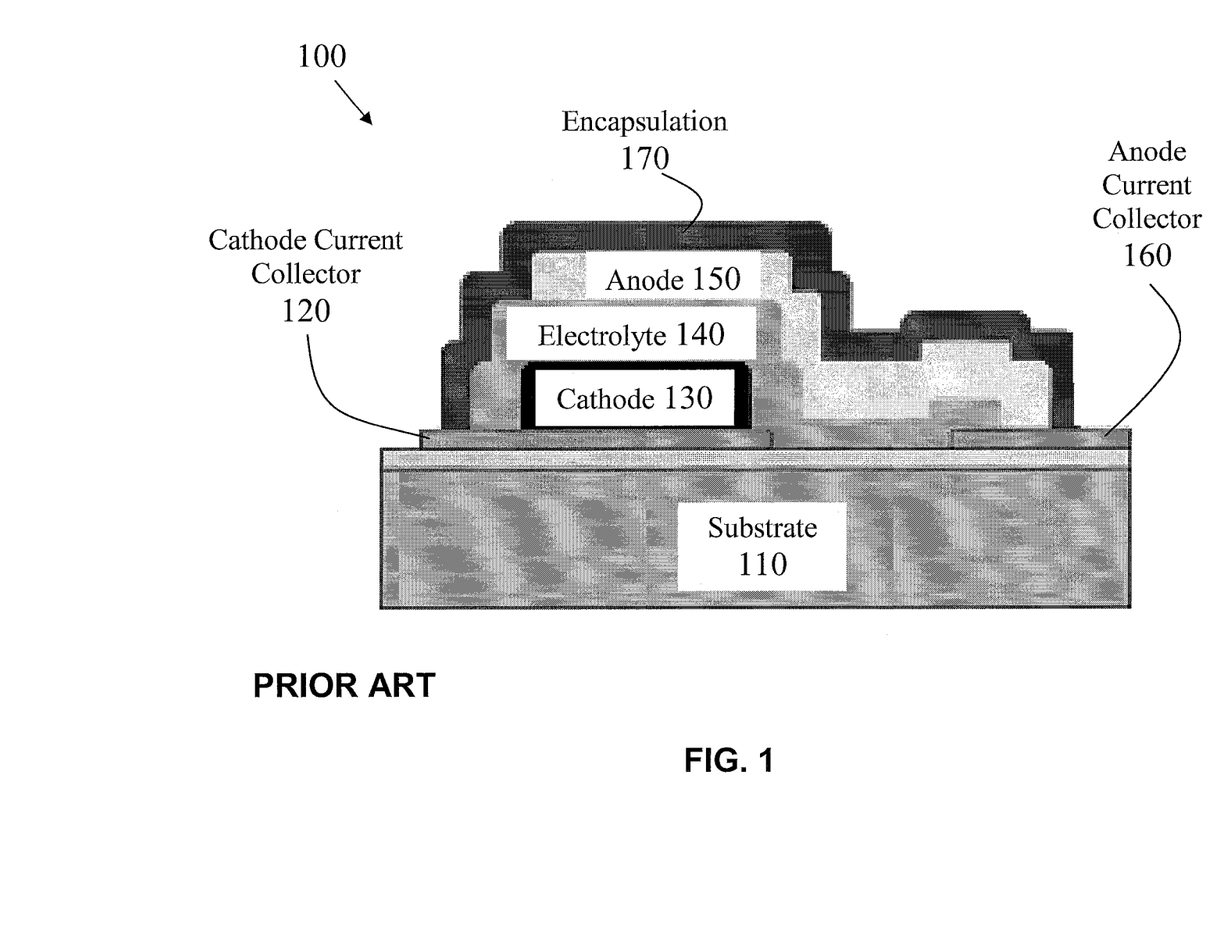
FIG. 1 is a cross-sectional representation of a prior art thin film battery.

FIG. 1 shows a cross-sectional representation of a typical thin film battery (TFB). The TFB device structure 100 with anode current collector 160 and cathode current collector 120 are formed on a substrate 110, followed by cathode 130, electrolyte 140 and anode 150; although the device may be fabricated with the cathode, electrolyte and anode in reverse order. Furthermore, the cathode current collector (CCC) and anode current collector (ACC) may be deposited separately. For example, the CCC may be deposited before the cathode and the ACC may be deposited after the electrolyte. The device may be covered by an encapsulation layer 170 to protect the environmentally sensitive layers from oxidizing agents. See, for example, N. J. Dudney, Materials Science and Engineering B 1 16, (2005) 245-249. Note that the component layers are not drawn to scale in the TFB device shown in FIG. 1.

In a typical TFB device structure, such as shown in FIG. 1, the electrolyte—a dielectric material such as Lithium Phosporous Oxynitride (LiPON)—is sandwiched between two electrodes—the anode and cathode. The conventional method used to deposit LiPON is physical vapor deposition (PVD) radio frequency (RF) sputtering of a $Li_3PO_4$ target in a $N_2$ ambient. However, this deposition process can lead to a very significant yield loss due to pinholes in the LiPON films, and pinhole density increases with application of increasing RF power during sputtering. One approach to minimizing pinholes involves depositing thicker films of LiPON—typically one to two microns thick—and when the cathode has poor surface morphology the thickness of the LiPON may need to be greater yet. However, this is still not completely effective in removing pinholes and increases the cost of the process step due to lower throughput and more costly overhead in terms of consumed materials.

Figure 2:
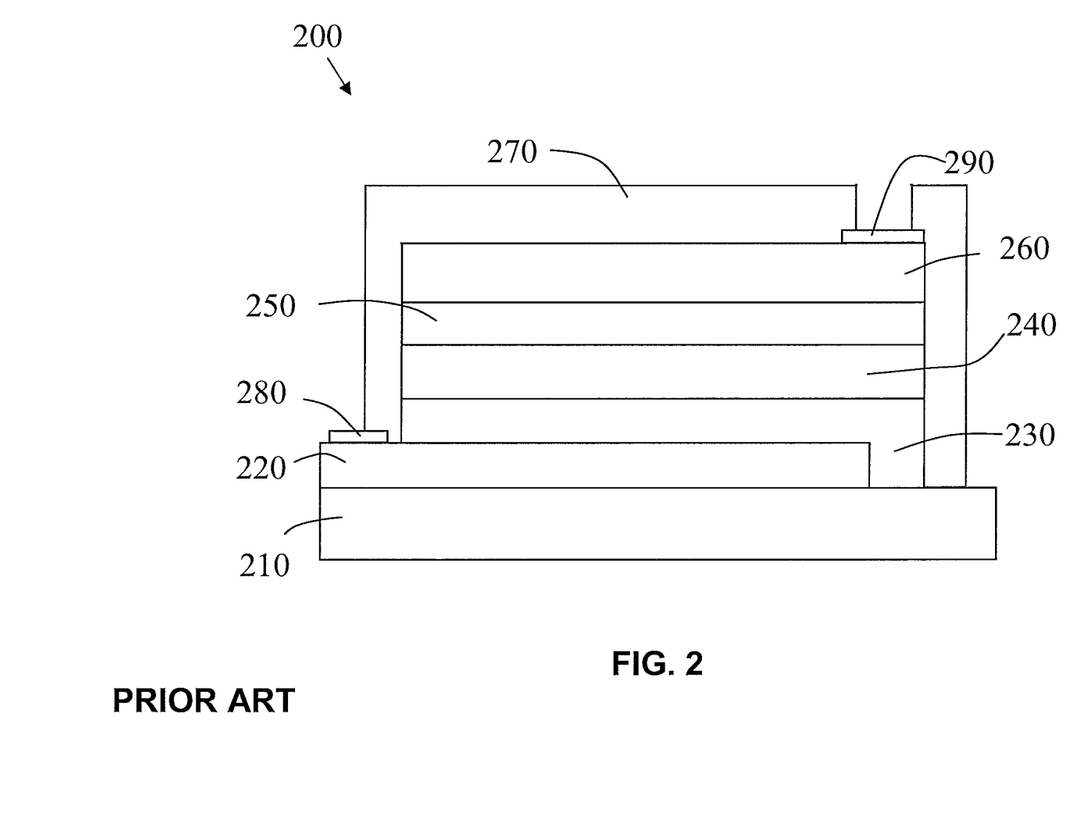
FIG. 2 is a cross-sectional representation of a prior art electrochromic device.

Similar considerations as for the TFB also apply to other electrochemical devices, such as the electrochromic device shown in FIG. 2.

Clearly, there is a need for improved solid state electrolyte films and deposition processes and equipment which can provide these solid state electrolyte films with higher ionic conductivity and lower pinhole density at low cost.

SUMMARY OF THE INVENTION

The present invention relates, in general, to solid state electrolyte layers with high ionic conductivity in electrochemical devices, and methods and tools for fabricating said electrolyte layers. Furthermore, these high ionic conductivity solid state electrolyte layers may be pinhole-free. The present invention is applicable generally to vacuum deposited electrolyte thin films, and is agnostic to the particular vacuum deposition technique that is used. Embodiments of the present invention may be applicable to solid state electrolytes in a broad range of electrochemical devices, including thin film batteries, electrochromic devices and ultracapacitors.

According to aspects of the present invention electrochemical devices may comprise solid state electrolytes with incorporated thin layers and/or particles of transition metal oxides, silicon, silicon oxide, and/or other suitable materials that will induce an increase in ionic conductivity of the electrolyte stack (for example, materials with which lithium is able to intercalate), or mixtures thereof. An improvement in ionic conductivity of the solid state electrolyte is expected which is proportional to the number of incorporated layers or a function of the distribution uniformity and density of the particles within the electrolyte.

According to some embodiments of the present invention, a method of depositing a solid state electrolyte film may include: depositing a thin layer of electrolyte on a substrate; stopping deposition of the electrolyte layer, and modifying the gas in the chamber if desired; inducing and maintaining a plasma in the vicinity of the substrate to provide ion bombardment of the deposited layer of electrolyte; depositing a thin layer of transition metal oxide, silicon, silicon oxide, or other suitable materials that will induce an increase in ionic conductivity of the electrolyte stack (for example, materials with which lithium is able to intercalate), or mixtures thereof on said thin layer of electrolyte; repeating the first depositing, stopping, inducing and second depositing steps to form an electrolyte stack; and depositing a thin layer of electrolyte on said electrolyte stack. Furthermore, said electrolyte may be LiPON.

According to some further embodiments of the present invention, a method of depositing a solid state electrolyte film may include: depositing a thin layer of electrolyte on a substrate wherein said electrolyte includes incorporated particles of transition metal oxide, silicon, silicon oxide, or other suitable materials that will induce an increase in ionic conductivity of the electrolyte stack (for example, materials with which lithium is able to intercalate), or mixtures thereof;

stopping deposition of the electrolyte layer, and modifying the gas in the chamber if desired; inducing and maintaining a plasma in the vicinity of the substrate to provide ion bombardment of the deposited layer of electrolyte; and repeating the depositing, stopping, and inducing steps to form an electrolyte stack. Furthermore, said electrolyte may be LiPON.

Furthermore, this invention describes tools configured for carrying out the above methods and tools for fabrication of the electrochemical devices with enhanced electrolyte materials, including continuous in-line processing tools.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention relates, in general, to solid state electrolyte layers with high ionic conductivity and nominally zero pinhole density in electrochemical devices, and methods for fabricating said electrolyte layers. According to aspects of the present invention electrochemical devices comprise solid state electrolytes with (1) incorporated thin layers and/or particles of transition metal oxides, silicon, silicon oxide or other suitable materials that will induce an increase in ionic conductivity of the electrolyte stack (for example, materials with which lithium is able to intercalate), or mixtures thereof, and (2) nominally zero pinhole density. An improvement in ionic conductivity of the solid state electrolyte is expected which is proportional to the number of incorporated layers or a function of the distribution uniformity and density of the incorporated particles within the electrolyte. Embodiments of the present invention are applicable to solid state electrolytes in a broad range of electrochemical devices including thin film batteries, electrochromic devices and ultracapacitors. For example, the ionic conductivity of a LiPON layer, a popular solid state electrolyte used in electrochemical devices such as thin film batteries and electrochromic devices, is improved by incorporating thin layers or particles of transition metal oxides, silicon, silicon oxide or other suitable materials that will induce an increase in ionic conductivity of the electrolyte stack (for example, materials with which lithium is able to intercalate), or mixtures thereof. The present invention can be realized using any method which is (1) able to incorporate thin layers of desired materials or incorporate fine particles of desired materials within a solid state electrolyte and (2) integrate plasma treatment into the deposition process for pinhole removal. The materials used for incorporated thin layers or particles can be any materials with intercalation capability to protons and alkali metal ions (e.g., $Na^+$, $K^+$ and $Li^+$).

In the present invention, the promotion of ionic conductivity for solid state electrolytes may be fulfilled by incorporating one or more thin layers into the bulk material of solid state electrolytes or by depositing solid state electrolyte films incorporating fine particles. The thin layers may be transition metal oxides (e.g., $WO_x$, $TiO_2$, $Ta_2O_5$, $NiO$, $MoO_2$, $CoO_2$, $V_2O_5$, $ReO_2$, $ZrO_2$), silicon, silicon oxide or other suitable materials that will induce an increase in ionic conductivity of the electrolyte stack (for example, materials with which lithium is able to intercalate), or mixtures thereof. The thickness of the incorporated layers is in the range of 1 nm-150 nm, and it is expected that a good working thickness is in the range of 5 nm-50 nm. Generally, the spacing of incorporated layers significantly exceeds the thickness of the incorporated layers. The fine particles are transition metals oxides, silicon, silicon oxide or other suitable materials that will induce an increase in ionic conductivity of the electrolyte stack (for example, materials with which lithium is able to intercalate), or mixtures thereof; the particles may range in size from atoms—substituted into the electrolyte lattice—to nanoparticles of 5-50 nm in diameter, and even to nanoparticles of 300-500 nm in diameter.

The addition of incorporated layers and/or particles into the electrolyte layer of an electrochemical device improves ionic conductivity for ions such as protons and alkali metal ions (e.g., $Na^+$, $K^+$ and $Li^+$) by distorting the electrolyte lattice in the vicinity of the incorporated layer/particle. The incorporated layers and/or particles with high lithium intercalation capability act as acceleration centers, which reduce the activation energy or chemical potential for lithium ion movement through the electrolyte lattice. Therefore, lithium ions move faster in the electrolyte layer comprising LiPON and incorporated layers and/or particles. Consequently, the ionic conductivity of LiPON is increased. These layers and particles may also induce lattice distortion of the LiPON material, creating larger interstitials for decreased resistance to movement of ions.

Figure 3:
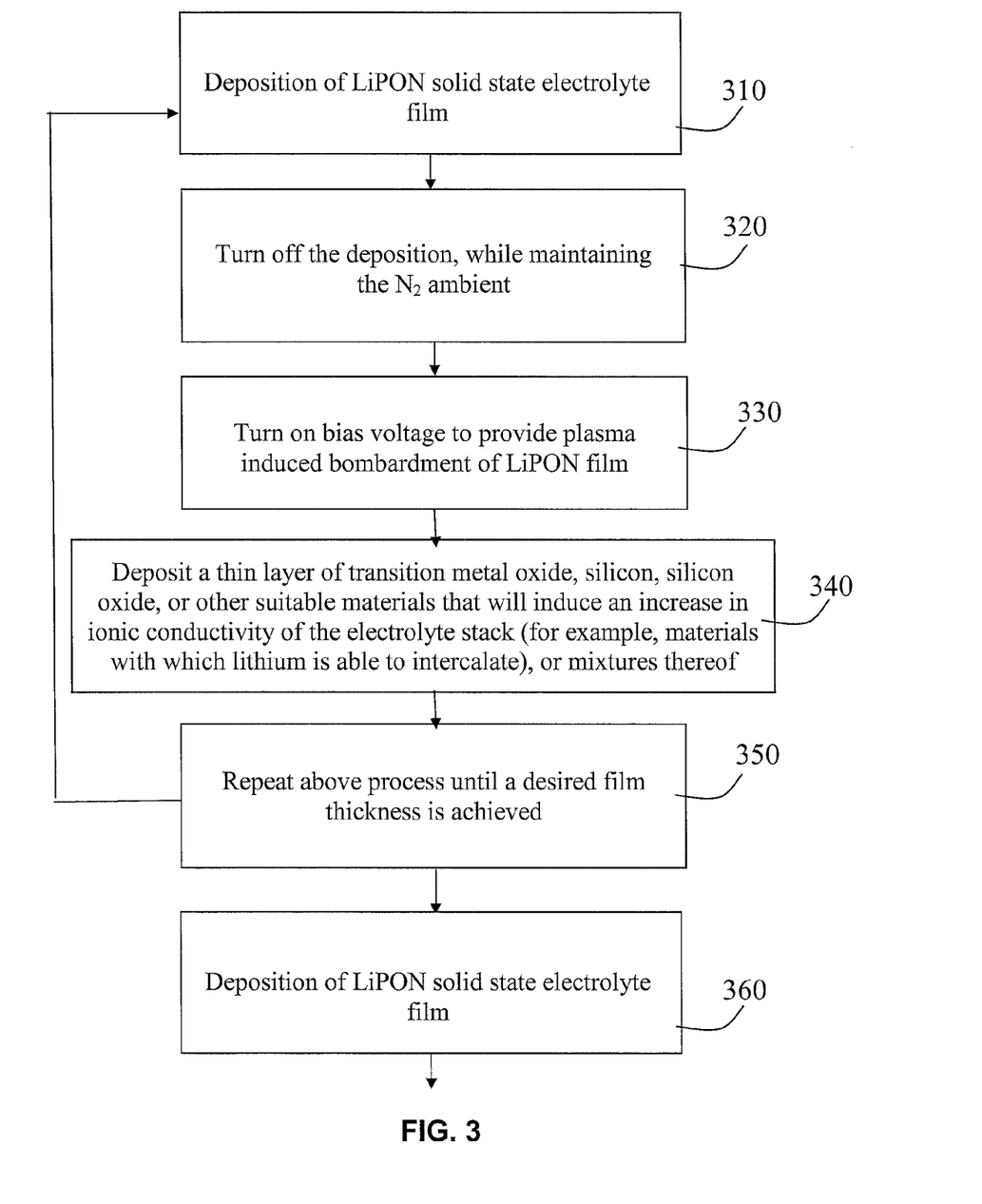
FIG. 3 is a flow chart for deposition of a pinhole-free high ionic conductivity LiPON thin film, according to some embodiments of the present invention.
Figure 8:
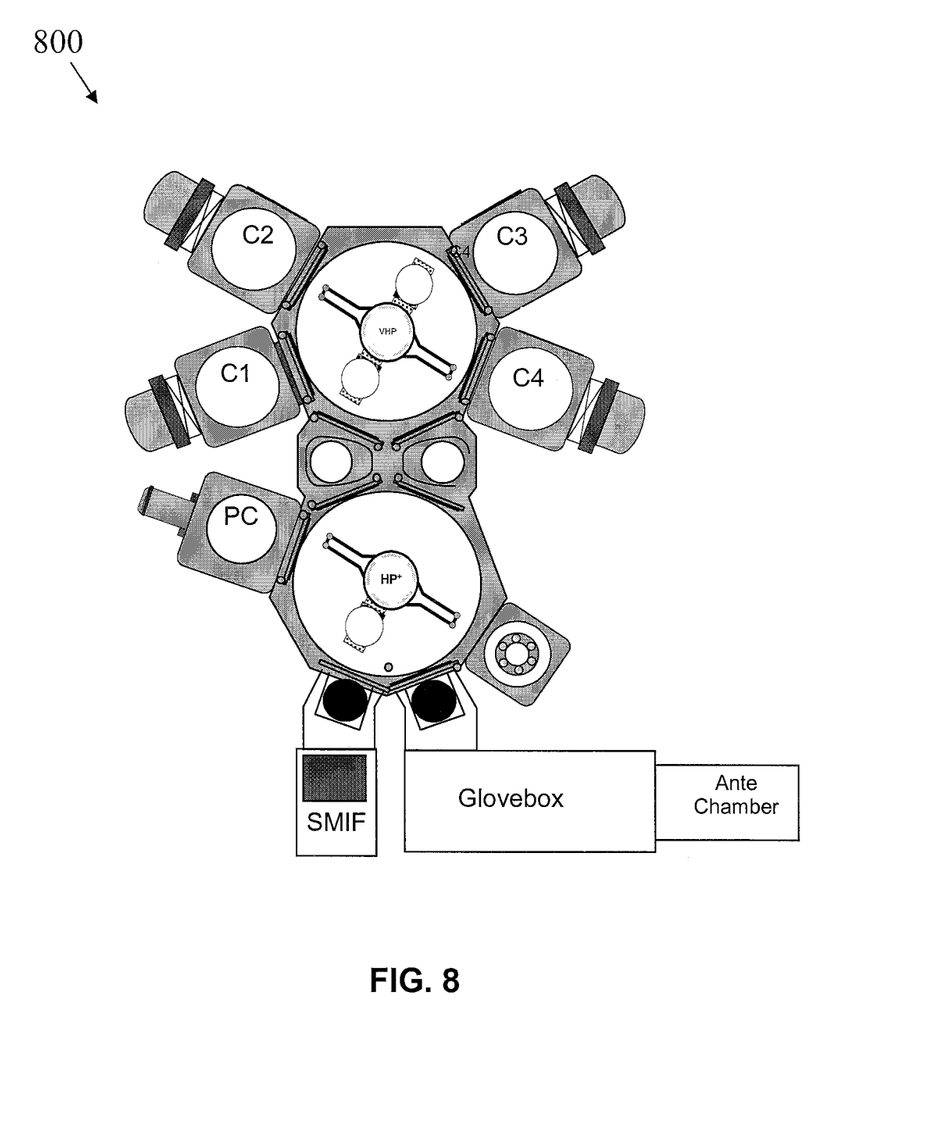
FIG. 8 is a schematic illustration of a thin film deposition cluster tool, according to some embodiments of the present invention.
Figure 9:
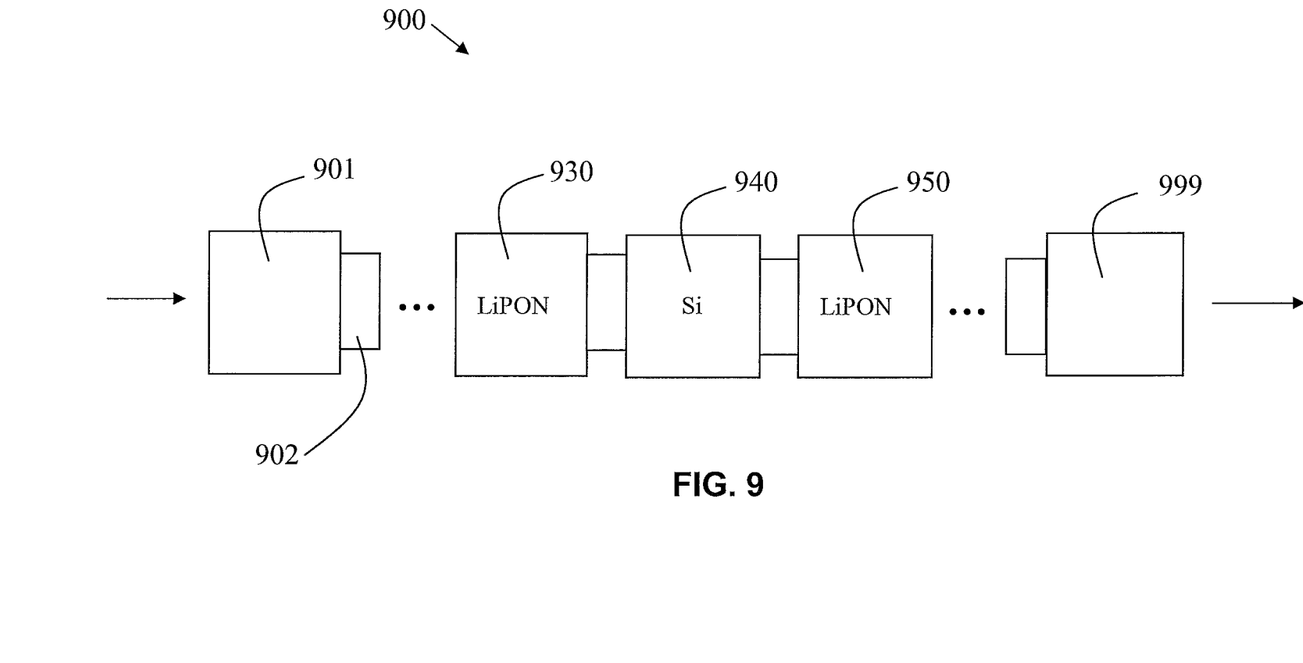
FIG. 9 is a representation of a thin film deposition system with multiple in-line tools, according to some embodiments of the present invention.

The plasma treatment for pinhole reduction/elimination may be integrated directly with a deposition process for the solid state electrolyte. The process according to some embodiments of the present invention is agnostic to the deposition method. (An example provided herein including an RF deposition method is just one example of many different deposition methods that may be used.) An example is shown in FIG. 3 for LiPON, where the following process flow is followed: RF deposition of LiPON solid state electrolyte film (310); turn off the RF source, while maintaining the $N_2$ ambient (320); turn on a bias voltage to provide a plasma induced bombardment of LiPON film (330); RF deposit a thin incorporated layer of transition metal oxide, silicon, silicon oxide, or other suitable materials that will induce an increase in ionic conductivity of the electrolyte stack (for example, materials with which lithium is able to intercalate), or mixtures thereof (340); repeat the above process until a desired film thickness is achieved (350); and RF deposit a LiPON solid state electrolyte thin film (360). Such a process can be integrated into a cluster tool or an in-line continuous processing system, such as shown in FIGS. 8 & 9, respectively. Furthermore, other process flows may be used in the present invention, such as: (A) in-situ plasma treatment may be in the thin layer deposition chamber, after the thin layer deposition is complete; (B) plasma treatment may be ex-situ—outside of the deposition chambers in a dedicated plasma chamber; (C) plasma treatment may be simultaneous with the deposition; and (D) plasma treatment may also be used after thin layer deposition if needed, providing the process does not have a detrimental impact on Li intercalation. Herein, the thin incorporated layers within the electrolyte stack typically have a thickness of a few nanometers to a few hundred nanometers, and more specifically a thickness of 1 nm to 150 nm.

According to some further embodiments of the present invention, a method of depositing a solid state electrolyte film may include: depositing a thin layer of electrolyte on a substrate wherein said electrolyte includes incorporated particles of transition metal oxide, silicon, silicon oxide, or other suitable materials that will induce an increase in ionic conductivity of the electrolyte stack (for example, materials with which lithium is able to intercalate), or mixtures thereof; stopping deposition of the electrolyte layer, and modifying the gas in the chamber if desired; inducing and maintaining a plasma in the vicinity of the substrate to provide ion bombardment of the deposited layer of electrolyte; and repeating the depositing, stopping, and inducing steps to form an electrolyte stack. Furthermore, said electrolyte may be LiPON.

According to some embodiments of the present invention, the electrolyte with incorporated layers may be deposited in a physical vapor deposition (PVD) chamber, such as a sputter deposition chamber, as given in the following example. In a first chamber, sputter a first layer of LiPON material on a substrate by PVD radio frequency (RF) sputtering of a $Li_3PO_4$ target in a $N_2$ ambient, then plasma treat the layer of LiPON to remove pinholes. Move the substrate to a second chamber where a first thin layer of $WO_x$ or Si is deposited by DC PVD sputtering. Repeat LiPON and incorporated layer depositions and plasma treatment until the desired thickness and number of incorporated layers has been achieved, finishing with a LiPON deposition. Alternatively, the depositions may be carried out in a single chamber with multiple targets, for example. Other thin film deposition methods, such as pulsed laser deposition (PLD), chemical vapor deposition (CVD) and atomic layer deposition (ALD) could be used for both the LiPON and the incorporated layers.

According to some embodiments of the present invention, the electrolyte with incorporated particles may be deposited in a physical vapor deposition (PVD) chamber, such as a sputter deposition chamber, as given in the following example. Sputter a thin layer of LiPON solid state electrolyte on a substrate by PVD radio frequency (RF) sputtering of a $Li_3PO_4$ target in a $N_2$ ambient, where the $Li_3PO_4$ target includes a small amount of additional material—one or more of transition metal oxide(s) (e.g., $WO_x$, $TiO_2$, $Ta_2O_5$, NiO, $MoO_2$, $CoO_2$, $V_2O_5$, $ReO_2$, $ZrO_2$), silicon, silicon oxide and other suitable materials that will induce an increase in ionic conductivity of the electrolyte stack (for example, materials with which lithium is able to intercalate). The additional material is distributed uniformly within the $Li_3PO_4$ target, thus providing a uniform distribution of particles within the deposited electrolyte layer. Plasma treat the thin layer to remove pinholes. Repeat the thin layer deposition and plasma treatment to form an electrolyte stack. Other thin film deposition methods, such as pulsed laser deposition (PLD), could be used for the electrolyte with incorporated particles.

Furthermore, a process flow for fabrication of a TFB, with a configuration such as shown in FIG. 1, according to some embodiments of the present invention may include the following steps. A conducting layer is deposited on a substrate 110. Anode 160 and cathode 120 current collectors are patterned from the conducting layer. A cathode layer 130 is deposited over the current collectors. The cathode layer is patterned. A (pinhole-free) electrolyte layer 140 including incorporated layers and/or incorporated particles, as described above, is deposited over the stack. The electrolyte layer is patterned. An anode layer 150 is deposited over the stack. The anode layer is patterned. An encapsulation layer 170 is deposited and patterned. Furthermore, as will be apparent to those skilled in the art, the deposition of the electrolyte layer according to embodiments of the present invention may be integrated into other TFB and electrochemical device process flows—for example, process flows described in U.S. Patent Appl. Publ. No. 2012/0321815.

For example, a process flow for fabrication of an EC device, with a configuration such as shown in FIG. 2, according to some embodiments of the present invention may include the following steps. A lower TCO layer 220 is deposited on a transparent substrate 210. The TCO layer is patterned. A cathode layer 230 is deposited on the TCO layer. A (pinhole-free) electrolyte layer 240 including incorporated layers and/or incorporated particles, as described above, is deposited on the cathode layer. An anode layer 250 is deposited on the electrolyte layer. An upper TCO layer 260 is deposited on the anode layer. The stack of layers deposited over the lower TCO layer is patterned. A protective coating 270 and electrical contacts 280 and 290 are deposited.

The present invention is applicable generally to the reduction of pinholes and improvement of ionic conductivity in deposited electrolyte thin films. Although specific examples of processes are provided for deposition of LiPON thin films, the processes of the present invention are applicable to the deposition of other electrolyte thin films, such as $TaO_x$, etc.

Furthermore, although the specific example of PVD RF sputtering of a $Li_3PO_4$ target in nitrogen ambient is provided for LiPON, the method of the present invention is agnostic to the specific deposition method for the electrolyte thin film—the method of the present invention is applicable generally to vacuum deposition of electrolyte thin films.

Figure 4A:
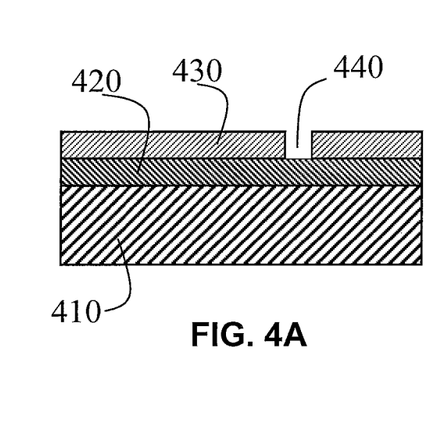
FIGS. 4A, 4B and 4C are a schematic illustration of pinhole removal during the plasma-only part of the deposition process, according to some embodiments of the present invention.
Figure 4B:
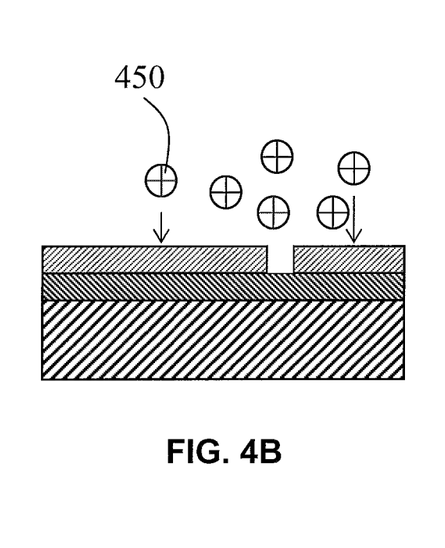
Figure 4C:
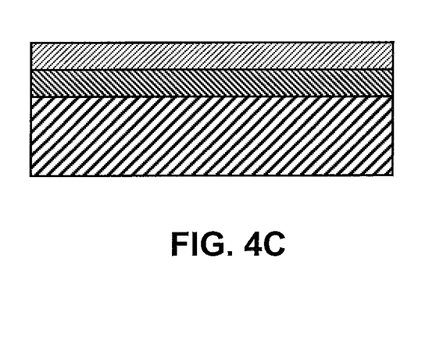

FIGS. 4A through 4C illustrate the process of pinhole repair by plasma treatment. In FIG. 4A a substrate 410 is covered by an electrode layer 420 and an electrolyte layer 430. The electrolyte layer 430 includes a pinhole 440. FIG. 4B shows the stack of FIG. 4A exposed to ions 450 from a plasma. The ions may be created in a plasma localized to the surface of the substrate, where a sufficient DC bias is applied to the substrate pedestal to attract the positive ions to the surface of the dielectric on the substrate with enough energy to (1) increase the surface mobility of adatoms and/or (2) sputter the surface atoms, which re-deposit on the surface of the dielectric layer. The effect of (1) and/or (2), along with a suitable selection of bias power and temperature, is surface modification and plugging of the pinholes, as shown in FIG. 4C.

A typical TFB device structure 100 is shown in FIG. 1, where anode current collector 160 and cathode current collector 120 are formed on a substrate 110, followed by cathode 130, electrolyte 140 and anode 150; although, the device may be fabricated with the cathode, electrolyte and anode in reverse order. Furthermore, the cathode current collector (CCC) and anode current collector (ACC) layers may be deposited separately. For example, the CCC may be deposited before the cathode and the ACC may be deposited after the electrolyte. The device may be covered by an encapsulation layer 170 to protect the environmentally sensitive layers from oxidizing agents. See, for example, N. J. Dudney, Materials Science and Engineering B 1 16, (2005) 245-249. Note that the component layers are not drawn to scale in the TFB device shown in FIG. 1. Pinhole-free electrolytes with high ionic conductivity are helpful in quickly transporting ions back and forth between the cathode and anode, resulting in fast charging/discharging. The TFB device as shown in FIG. 1 may benefit from an electrolyte layer with higher ionic conductivity, with incorporated layers and/or incorporated particles, as described above for some embodiments of the present invention.

A prior art electrochromic device 100 is represented in FIG. 2. See Granqvist, C.-G., Nature Materials, v5, n2, February 2006, p 89-90; C.-G. Granqvist *Handbook of Inorganic Electrochromic Materials*, Elsevier, 1995; and U.S. Pat. No. 5,995,271 to Zieba et al. The device 200 comprises a glass substrate 210, lower transparent conductive oxide (TCO) layer 220, a cathode 230, a solid state electrolyte 240, a counter electrode (anode) 250, upper TCO layer 260, a protective coating 270, a first electrical contact 280 (to the lower TCO layer 220), and a second electrical contact 290 (to the upper TCO layer 260). Furthermore, there may be a diffusion barrier layer (not shown) between the glass substrate 210 and the lower TCO layer 220, to reduce the diffusion of ions from the glass substrate into the TCO layer, and vice versa. Note that the component layers are not drawn to scale in the electrochromic devices shown in FIG. 2. For example, a typical glass substrate is of the order of a millimeter thick and a typical electrochromic device covers the fully exposed area of the architectural glass, or rear-view mirror, for example. Other substrate materials may be used, for example plastics such as polyimide (PI), polyethylene terephthalate (PET) and polyethylene naphthalate (PEN).

Switching from a transparent to a colored state for the EC device occurs when ions (such as lithium or hydrogen ions) are driven from the counter electrode 250, through the (non-electrically conductive) solid state electrolyte 240, to the cathode 230. The counter electrode 250 is an ion storage film, and the cathode 230 is electrochromic—providing the desired change in light transmission properties. It is also possible for the counter electrode 250 to function as the electrochromic layer if this layer undergoes an "anodic coloration," where the layer changes from transparent to colored with de-intercalation of the ion. In this case, the total change from clear to colored would be the sum of the complementary changes in both the cathode (electrochromic layer) and the counter electrode (anodic coloring). Electrolytes with high ionic conductivity are helpful in quickly transporting ions back and forth between the cathode and anode, resulting in fast switching. The electrochromic device as shown in FIG. 2 may benefit from a pinhole-free electrolyte layer with high ionic conductivity, with incorporated layers and/or incorporated particles, as described above for some embodiments of the present invention.

Figure 5:
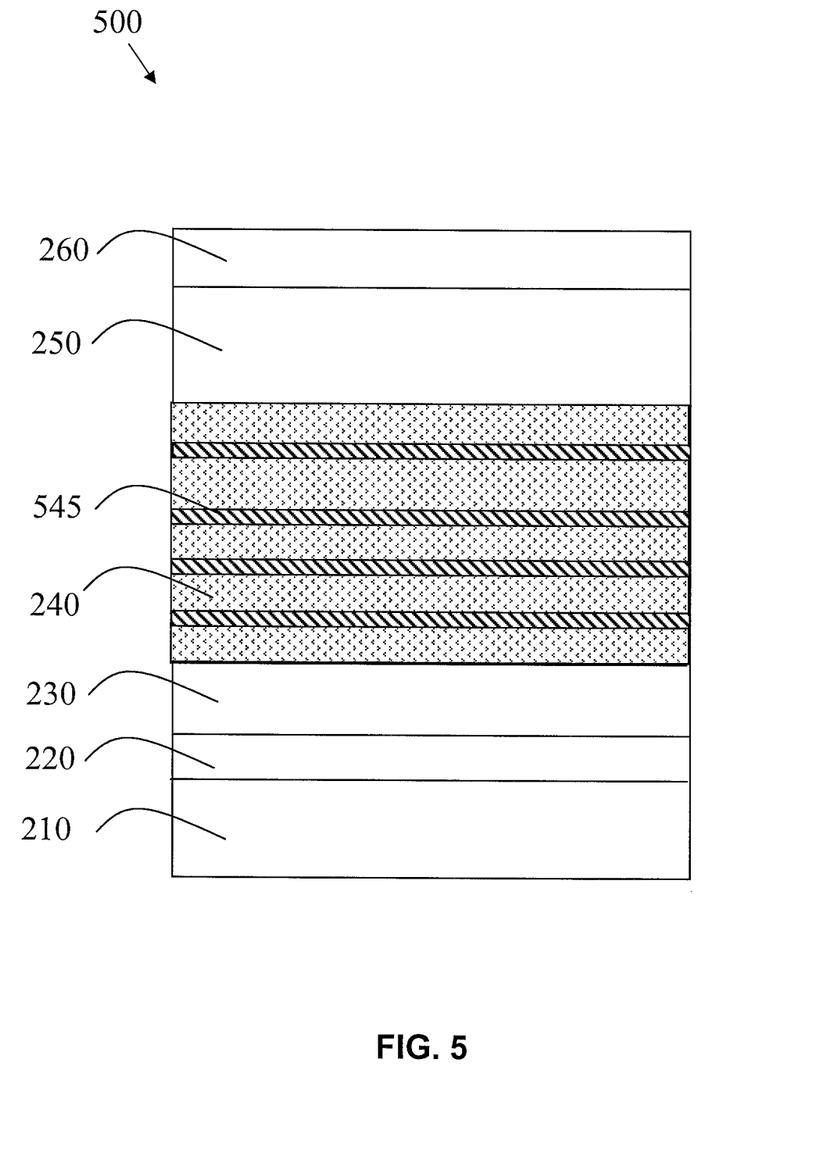
FIG. 5 is a schematic cross-sectional representation of a thin film battery with a high ionic conductivity solid state electrolyte with incorporated thin layers, according to some embodiments of the present invention.

FIG. 5 shows a schematic of an electrochemical device 500—in this example an electrochromic device—with incorporated layers 545, according to some embodiments of the present invention. Note that the stack of FIG. 5 is similar to the TFB stack described in Kwak et al., U.S. Patent Appl. Publ. No. 2009/0148764—the TFB thin film stack having the following layers: cathode current collector, cathode, electrolyte, anode and anode current collector.

An advantage of the present invention is that it significantly increases ionic conductivity of solid state electrolytes. Test results are provided in FIG. 6, in which the ionic conductivities for LiPON solid state electrolyte samples (approximately one micron thick) with various numbers of incorporated thin (<30 nm) $WO_x$ or Si layers are shown. The LiPON electrolyte samples with incorporated layers are prepared as deposited films with metal electrodes on both sides. Compared with the solid state electrolyte without incorporated layers, the samples with incorporated layers of either $WO_x$ or Si showed a significant increase in ionic conductivity. The ionic conductivity of the LiPON film with one incorporated thin $WO_x$ layer was doubled, compared with the one without any incorporated layer (2.9 µS/cm with one layer of $WO_x$ vs. 1.33 µS/cm without an incorporated layer). Furthermore, the ionic conductivities of the LiPON films with two incorporated thin $WO_x$ layers and five incorporated thin silicon layers increased 2.6 times and 7.7 times, respectively, from the baseline value. In general, it is found that the increase of ionic conductivity by using this method is proportional to the number of incorporated thin layers. Note that the data shown in FIG. 6 is for electrolyte stacks which have not been plasma treated for pinhole reduction—it is expected that the data will show further improvement with incorporation of the plasma treatment into the electrolyte stack preparation.

Figure 6:
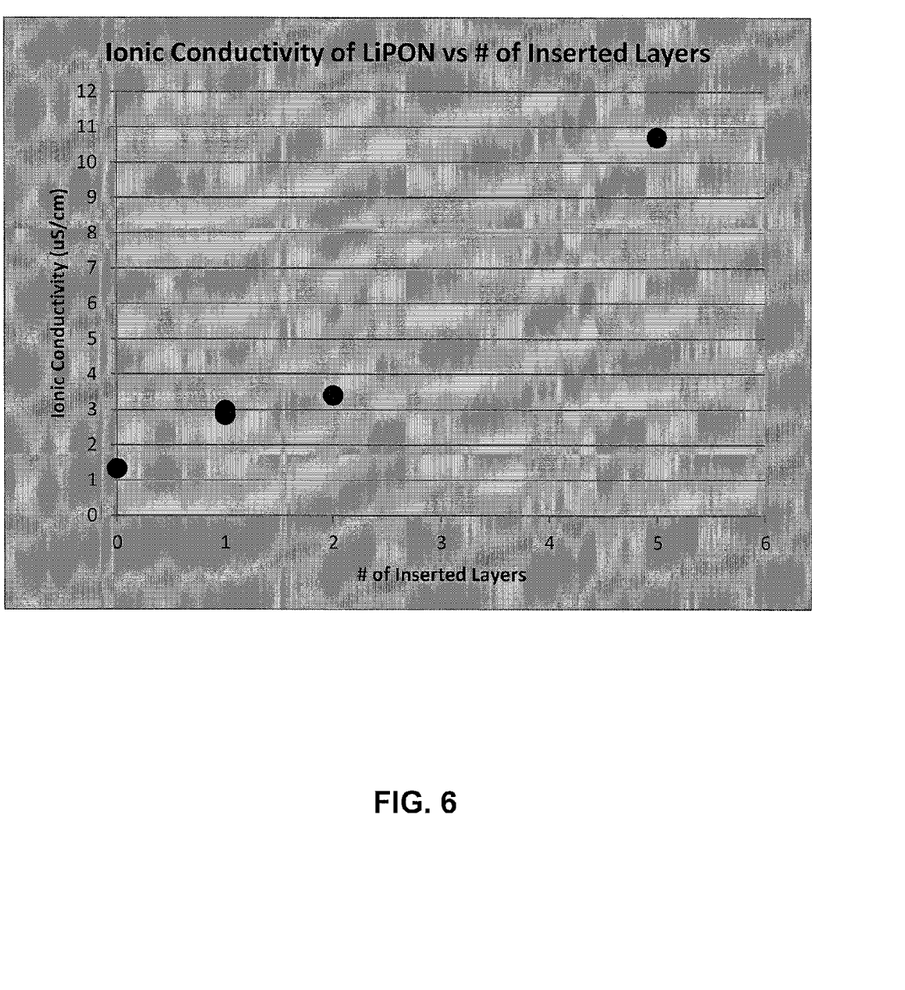
FIG. 6 is a graph of ionic conductivity as a function of the number of incorporated layers in a solid state electrolyte, according to some embodiments of the present invention.

The following explanation is proposed to explain the measurements shown in FIG. 6. For a solid state electrolyte without incorporated layers, $Li^+$ ions travel at a certain constant speed. However, for a solid state electrolyte containing incorporated layers, it is expected that $Li^+$ ions travel at the same constant speed when they are in the bulk but at a faster speed when close to the incorporated layers due to reduced chemical potential for $Li^+$ movement close to the incorporated layers. For example, the presence of non-LiPON layers within the LiPON electrolyte produces more interfacial strain and stress, hence greater lattice distortion, than is caused by the incorporation of nitrogen into $Li_3PO_4$ when depositing the LiPON electrolyte. (Nitrogen incorporation into $Li_3PO_4$ disrupts the $PO_4$ network structure and forms a material with stoichiometry of roughly $Li_3PO_{4-x}N_y$, in which there are larger interstitials for Li$^+$ transport.) The greater lattice distortion allows freer movement of Li$^+$ through the LiPON electrolyte network.

Furthermore, the more incorporated layers, the less the travel time; although, in principle, there is an upper limit to the number of incorporated layers, since it is desired not to affect the electrical conductivity of the solid state electrolyte layer. In practice, the incorporated layers may constitute only a small fraction of the total volume of the solid state electrolyte layer and the existence of the incorporated layers does not have a significant impact on the electrical conductivity of the solid state electrolyte. Note that the movement of lithium ions inside the incorporated layers is dependent on the migration speed of the ions in the incorporated material and lithium ions have a high migration speed in materials with high intercalation capability, such as the transition metal oxides and silicon. The presence of the incorporated layers inside the solid state electrolyte is beneficial to the overall ion travel time through the solid state electrolyte layer.

Considering the above, including the data provided in FIG. 6, it is expected that a high ionic conductivity solid state electrolyte comprising LiPON and an enhancing material can be engineered to have an ionic conductivity greater than those without a doping layer, and may even in some examples reach an ionic conductivity of greater than 10 microsiemens per centimeter, using either continuous layers or uniformly distributed particles formed of enhancing materials such as transition metal oxides, silicon and silicon oxide, incorporated within the LiPON.

Figure 7:
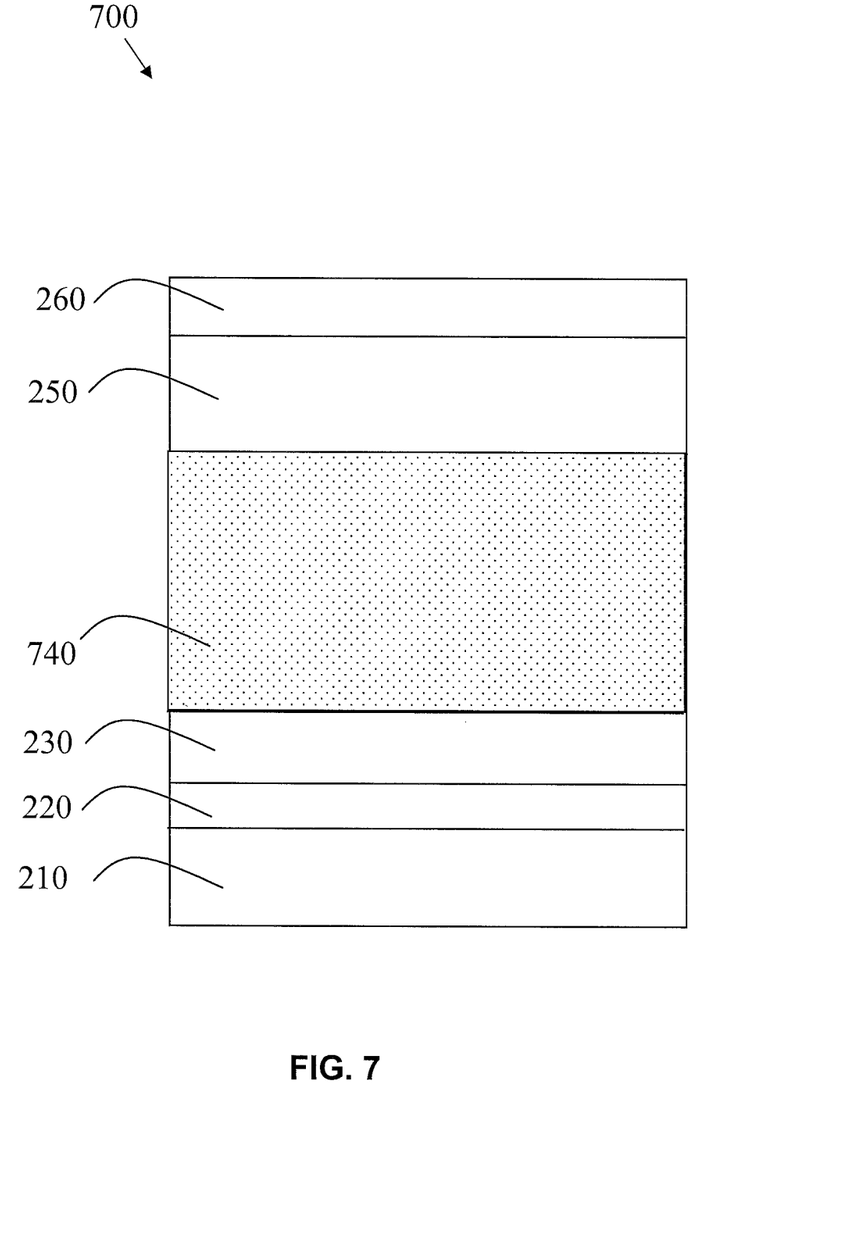
FIG. 7 is a schematic cross-sectional representation of a thin film battery with a high ionic conductivity solid state electrolyte with incorporated particles, according to some embodiments of the present invention.

FIG. 7 shows a schematic of an electrochemical device 700—in this example an electrochromic device—with an electrolyte layer 740 comprising a bulk electrolyte material with incorporated particles, according to some embodiments of the present invention. It is expected that the incorporated particles in the solid state electrolyte will provide a more dramatic effect in promoting ionic conductivity than the incorporated layers—for a solid state electrolyte containing uniformly distributed particles there are more acceleration centers and the Li$^+$ ion travel time is expected to be even shorter than for the solid state electrolyte comprising incorporated layers due to the Li$^+$ ions being surrounded by the particles with a good lithium intercalation capacity, which effectively reduces the chemical potential for Li$^+$ ion movement through the solid state electrolyte. It is expected that the ion travel speed will be almost constant and fast throughout the electrolyte. For example, the presence of non-LiPON particles within the LiPON electrolyte produces more interfacial strain and stress, hence greater lattice distortion, than is caused by the incorporation of nitrogen into Li$_3$PO$_4$ when depositing the LiPON electrolyte. The greater lattice distortion allows freer movement of Li$^+$ through the LiPON electrolyte network. Note that for electrochromic applications the electrolyte stack will need to have good transparency to light; consequently electrolyte materials and dopants (incorporated layers and particles) must be chosen accordingly.

According to further embodiments of the present invention, solid state electrolyte layers of electrochemical devices may include both incorporated layers and incorporated particles.

Details of the tool configurations that may be used for plasma treatment for pinhole reduction, and also further processing details, are found in U.S. Patent Appl. Publ. No. 2012/0318664.

FIG. 8 is a schematic illustration of a processing system 800 for fabricating an electrochemical device, such as a TFB device according to some embodiments of the present invention. The processing system 800 includes a standard mechanical interface (SMIF) to a cluster tool equipped with a plasma clean (PC) chamber and process chambers C1-C4, which may be utilized in the process steps described above. A glovebox may also be attached to the cluster tool if needed. The glovebox can store substrates in an inert environment (for example, under a noble gas such as He, Ne or Ar), which is useful after alkali metal/alkaline earth metal deposition. An ante chamber to the glovebox may also be used if needed—the ante chamber is a gas exchange chamber (inert gas to air and vice versa) which allows substrates to be transferred in and out of the glovebox without contaminating the inert environment in the glovebox. (Note that a glovebox can be replaced with a dry room ambient of sufficiently low dew point, as used by lithium foil manufacturers.) The chambers C1-C4 can be configured for process steps for manufacturing TFBs, electrochromic devices, etc. which may include deposition of an electrolyte with incorporated layers and/or incorporated particles, as described above. For example, TFB device fabrication may include: deposition of an electrolyte layer (e.g. LiPON by RF sputtering a Li$_3$PO$_4$ target in N$_2$); plasma pinhole filling; deposition of a thin layer of an ionic conductivity enhancing layer of Si, etc. as described above. It is to be understood that while a cluster arrangement has been shown for the processing system 800, a linear system may be utilized in which the processing chambers are arranged in a line without a transfer chamber so that the substrate continuously moves from one chamber to the next chamber.

FIG. 9 shows a representation of an in-line fabrication system 900 with multiple in-line tools 910, 920, 930, 940, etc. to 999, according to some embodiments of the present invention. In-line tools may include tools for depositing all the layers of an electrochemical device—including both TFBs and electrochromic devices. Furthermore, the in-line tools may include pre- and post-conditioning chambers. For example, tool 910 may be a pump down chamber for establishing a vacuum prior to the substrate moving through a vacuum airlock 915 into a deposition tool 920. Some or all of the in-line tools may be vacuum tools separated by vacuum airlocks 915. Note that the order of process tools and specific process tools in the process line will be determined by the particular electrochemical device fabrication method being used. For example, one of the in-line tools may be dedicated to depositing an electrolyte layer with incorporated layers and/or incorporated particles; alternatively, a number of alternating LiPON and incorporated layer deposition tools may be used to form the complete electrolyte layer. Furthermore, one or more of the in-line tools may be dedicated to depositing a LiPON electrolyte layer according to some embodiments of the present invention in which a plasma pinhole reduction process is used, as described above—tools 930 and 950—and other tools are dedicated to deposition of thin layers of Si, for example, for improving the ionic conductivity of the electrolyte 940. Yet furthermore, some embodiments may include dedicated plasma conditioning chambers—for example, plasma conditioning chambers situated in-line after chambers 930 and 950, where the latter provide only the LiPON deposition. Furthermore, substrates may be moved through the in-line fabrication system oriented either horizontally or vertically. Yet furthermore, the in-line system may be adapted for reel-to-reel processing of a web substrate.

Figure 10:
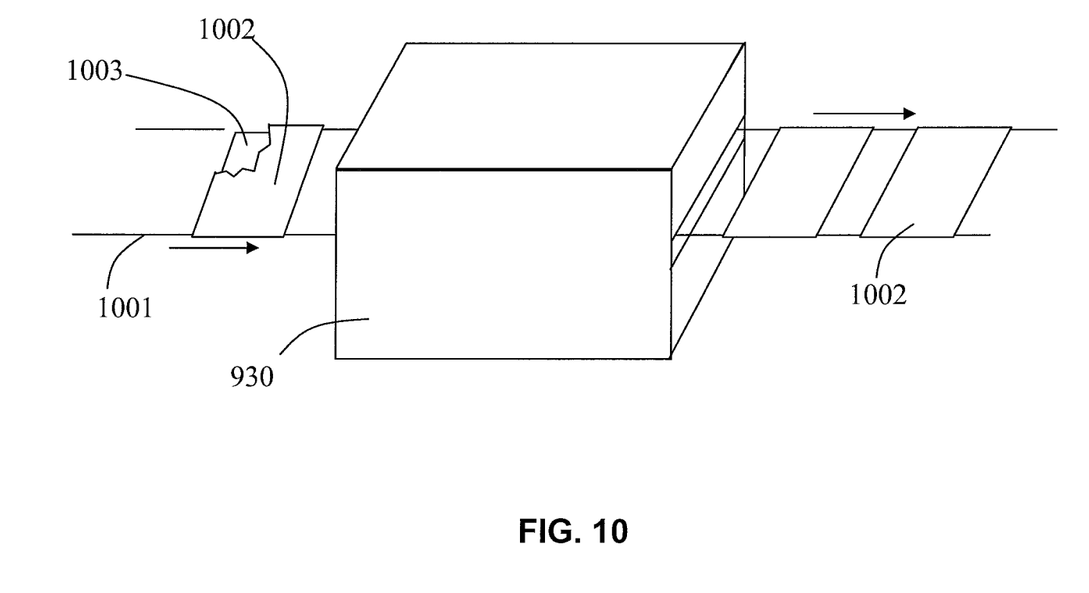
FIG. 10 is a representation of an in-line deposition tool, according to some embodiments of the present invention.

In order to illustrate the movement of a substrate through an in-line fabrication system such as shown in FIG. 9, in FIG. 10 a substrate conveyer 1001 is shown with only one in-line tool 930 in place. A substrate holder 1002 containing a substrate 1003 (the substrate holder is shown partially cut-away so that the substrate can be seen) is mounted on the conveyer 1001, or equivalent device, for moving the holder and substrate through the in-line tool 930, as indicated. A suitable in-line platform for processing tool 910 with vertical substrate configuration is Applied Materials' New Aristo™. A suitable in-line platform for processing tool 910 with horizontal substrate configuration is Applied Materials' Aton™. Furthermore, an in-line process can be implemented on a reel-to-reel system, such as Applied Materials' SmartWeb™.

An apparatus for depositing a solid state electrolyte thin film according to embodiments of the present invention may comprise a first system for: depositing a thin layer of electrolyte; stopping deposition of the electrolyte layer, and modifying the gas in the chamber if desired; inducing and maintaining a plasma in the vicinity of the substrate to provide ion bombardment of the deposited layer of electrolyte; depositing a thin layer of transition metal oxide, silicon, silicon oxide, or other suitable materials that will induce an increase in ionic conductivity of the electrolyte stack (for example, materials with which lithium is able to intercalate), or mixtures thereof; repeating the depositing, stopping, inducing and depositing steps until a desired thickness of electrolyte is deposited; and depositing a thin layer of electrolyte. However, the repeating of the depositing, stopping and inducing may be in second, third, etc. systems, depending on the number of repetitions required and the throughput required from the first apparatus. The first apparatus may be a cluster tool or an in-line tool. Furthermore, in an in-line or reel-to-reel apparatus the depositing and inducing steps may be carried out in separate, adjacent systems, and further pairs of systems for depositing and inducing steps may be added in-line as needed for repetitions of the depositing and inducing steps. Yet furthermore, a dedicated plasma conditioning system may be included in a cluster tool.

The apparatus of FIGS. 8 and 9 may be used to fabricate electrochromic devices according to some embodiments of the present invention. For example, in a first system, such as C1 or 930, a lower TCO layer is deposited over a substrate. In a second system, a cathode layer is deposited over the first conductive layer. In a third system, a (pinhole-free) high ionic conductivity electrolyte layer is deposited over the cathode layer, said layer having incorporated layers and/or incorporated particles. In a fourth system, an anode layer is deposited over the electrolyte layer. In a fifth system an upper TCO layer is deposited over the anode layer. Further systems may be used for deposition of other device layers, as described above, such as a protective barrier layer and/or a capping layer.

The apparatus of FIGS. 8 and 9 may be used to fabricate TFB devices according to some embodiments of the present invention. For example, in a first system, such as C1 or 930, a cathode current collector layer is deposited over a substrate. In a second system, a cathode layer is deposited over the first conductive layer. In a third system, a (pinhole-free) high ionic conductivity electrolyte layer is deposited over the cathode layer, said layer having incorporated layers and/or incorporated particles. In a fourth system, an anode layer is deposited over the electrolyte layer. In a fifth system an anode current collector layer is deposited over the anode layer. Further systems may be used for deposition of other device layers, as described above, such as a protective barrier layer and/or a capping layer.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. An electrochemical device comprising:
   a first electrode;
   a second electrode;
   a solid state electrolyte layer between said first and second electrodes, said solid state electrolyte layer comprising a solid state electrolyte material and an enhancing material incorporated in said solid state electrolyte material for increasing the ionic conductivity for lithium ion movement through said solid state electrolyte layer;
   wherein said solid state electrolyte layer comprises a continuous layer of said enhancing material incorporated within said solid state electrolyte material, and wherein said continuous layer has a thickness in the range of 1 nm to 150 nm.

2. The electrochemical device as in claim 1, wherein said solid state electrolyte material is LiPON.

3. The electrochemical device as in claim 1, wherein said enhancing material comprises at least one material selected from the group consisting of transition metal oxides, silicon and silicon oxide.

4. The electrochemical device as in claim 1, wherein said continuous layer has a thickness in the range of 5 nm to 50 nm.

5. The electrochemical device as in claim 1, wherein said electrochemical device is a thin film battery.

6. The electrochemical device as in claim 1, wherein said solid state electrolyte layer has an ionic conductivity more than two times that of said solid state electrolyte material without incorporation of said enhancing material.

7. The electrochemical device as in claim 1, wherein said solid state electrolyte layer has an ionic conductivity more than five times that of said solid state electrolyte material without incorporation of said enhancing material.

8. The electrochemical device as in claim 1, wherein said solid state electrolyte material is LiPON and said solid state electrolyte layer has an ionic conductivity greater than 10 microsiemens per centimeter.

9. An electrochemical device comprising:
   a first electrode;
   a second electrode;
   a solid state electrolyte layer between said first and second electrodes, said solid state electrolyte layer comprising a solid state electrolyte material and an enhancing material incorporated in said solid state electrolyte material for increasing the ionic conductivity for lithium ion movement through said solid state electrolyte layer;
   wherein said solid state electrolyte layer comprises a plurality of parallel continuous layers of said enhancing material incorporated within said solid state electrolyte material.

10. The electrochemical device as in claim 9, wherein said solid state electrolyte material is LiPON.

11. The electrochemical device as in claim 9, wherein said enhancing material comprises at least one material selected from the group consisting of transition metal oxides, silicon and silicon oxide.

12. The electrochemical device as in claim 9, wherein said electrochemical device is a thin film battery.

13. The electrochemical device as in claim 9, wherein said solid state electrolyte layer has an ionic conductivity more than two times that of said solid state electrolyte material without incorporation of said enhancing material.

14. The electrochemical device as in claim 9, wherein said solid state electrolyte layer has an ionic conductivity more than five times that of said solid state electrolyte material without incorporation of said enhancing material.

15. The electrochemical device as in claim 9, wherein said solid state electrolyte material is LiPON and said solid state electrolyte layer has an ionic conductivity greater than 10 microsiemens per centimeter.

16. The electrochemical device as in claim 9, wherein each of the layers of said plurality of parallel continuous layers has a thickness in the range of 1 nm to 150 nm.

17. The electrochemical device as in claim 9, wherein each of the layers of said plurality of parallel continuous layers has a thickness in the range of 5 nm to 50 nm.

18. A method of fabricating an electrochemical device, comprising:
   depositing a first layer of solid state electrolyte material on a first electrode;
   after said depositing said first layer of solid state electrolyte material, inducing and maintaining a plasma over said first layer of solid state electrolyte material to provide ion bombardment of said first layer of solid state electrolyte material for pinhole reduction in said first layer of solid state electrolyte material;
   depositing a continuous layer of enhancing material on the ion bombarded surface of said first layer of solid state electrolyte material;
   depositing a second layer of solid state electrolyte material on said continuous layer of enhancing material;
   after said depositing said second layer of solid state electrolyte material, inducing and maintaining a plasma over said second layer of solid state electrolyte material to provide ion bombardment of said second layer of solid state electrolyte material for pinhole reduction in said second layer of solid state electrolyte material;
   forming a second electrode;
   wherein said first layer of solid state electrolyte material, said continuous layer of enhancing material and said second layer of solid state electrolyte material form a solid state electrolyte layer between said first and second electrodes, said continuous layer of enhancing material increases the ionic conductivity for lithium ion movement through said solid state electrolyte layer, and wherein said continuous layer of enhancing material has a thickness in the range of 1 nm to 150 nm.

19. The method as in claim 18, wherein said solid state electrolyte material is LiPON.

20. The method as in claim 18, wherein said enhancing material comprises at least one material selected from the group consisting of transition metal oxides, silicon and silicon oxide.

21. The method as in claim 18, wherein said depositing is vacuum depositing in a process chamber.

22. A method of fabricating an electrochemical device, comprising:
   depositing a first layer of solid state electrolyte material on a first electrode;
   after said depositing said first layer of solid state electrolyte material, inducing and maintaining a plasma over said first layer of solid state electrolyte material to provide ion bombardment of said first layer of solid state electrolyte material for pinhole reduction in said first layer of solid state electrolyte material;
   depositing a continuous layer of enhancing material on the ion bombarded surface of said first layer of solid state electrolyte material;
   depositing a further layer of solid state electrolyte material on said continuous layer of enhancing material;
   after said depositing said further layer of solid state electrolyte material, inducing and maintaining a plasma over said further layer of solid state electrolyte material to provide ion bombardment of said further layer of solid state electrolyte material for pinhole reduction in said further layer of solid state electrolyte material;
   repeating said depositing a continuous layer of enhancing material, depositing a further layer of solid state electrolyte material, and inducing and maintaining a plasma over said further layer of solid state electrolyte material until a predetermined plurality of parallel continuous layers of enhancing material and plurality of further layers of solid state electrolyte are deposited; and
   forming a second electrode;
   wherein said first layer of solid state electrolyte material, said plurality of parallel continuous layers of enhancing material and said plurality of further layers of solid state electrolyte material form a solid state electrolyte layer between said first and second electrodes, and wherein said plurality of parallel continuous layers of enhancing material increase the ionic conductivity for lithium ion movement through said solid state electrolyte layer.

23. The method of claim 22, wherein said solid state electrolyte material is LiPON.

24. The method as in claim 22, wherein said enhancing material comprises at least one material selected from the group consisting of transition metal oxides, silicon and silicon oxide.

25. The method as in claim 22, wherein said depositing is vacuum depositing in a process chamber.

* * * * *